US009634680B1

(12) United States Patent
Ray et al.

(10) Patent No.: US 9,634,680 B1
(45) Date of Patent: Apr. 25, 2017

(54) LARGE-ERROR DETECTION AND CORRECTION OF DIGITAL SAMPLE SEQUENCE FROM ANALOG-TO-DIGITAL CONVERTER

(71) Applicant: Keysight Technologies, Inc., Minneapolis, MN (US)

(72) Inventors: Sourja Ray, Cupertino, CA (US); Brian D. Setterberg, Menlo Park, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/332,146

(22) Filed: Oct. 24, 2016

(51) Int. Cl.
 *H03M 1/06*   (2006.01)
 *H03M 1/10*   (2006.01)
 *H03M 1/12*   (2006.01)

(52) U.S. Cl.
 CPC ....... *H03M 1/0629* (2013.01); *H03M 1/1009* (2013.01); *H03M 1/1023* (2013.01); *H03M 1/1033* (2013.01); *H03M 1/12* (2013.01)

(58) Field of Classification Search
 CPC ............. H03M 1/0629; H03M 1/1009; H03M 1/1023; H03M 1/1033; H03M 1/12
 USPC .......................................... 341/120, 118, 155
 See application file for complete search history.

(56) References Cited

U.S. PATENT DOCUMENTS

| | | | | |
|---|---|---|---|---|
| 7,079,059 | B2 * | 7/2006 | Adams .................... | H03H 17/06 341/118 |
| 7,280,064 | B2 * | 10/2007 | Lin ...................... | H03M 1/0695 341/120 |
| 7,630,464 | B1 | 12/2009 | Deboes et al. | |
| 7,649,175 | B2 * | 1/2010 | Wellnitz ................ | G01T 1/1647 250/252.1 |
| 8,717,209 | B2 * | 5/2014 | Wu ...................... | H03M 1/0626 341/118 |
| 8,736,479 | B2 | 5/2014 | Keane | |
| 8,976,913 | B2 | 3/2015 | Buehner et al. | |
| 9,124,291 | B2 | 9/2015 | Chen et al. | |
| 2009/0016471 | A1 | 1/2009 | Rajagopal | |

OTHER PUBLICATIONS

Un-Ku Moon et al. "Background Digital Calibration Techniques for Pipelined ADC's," IEEE Transactions on Circuits and Systems—II: Analog and Digital Signal Processing, vol. 44, No. 2, Feb. 1997, pp. 102-109.

* cited by examiner

*Primary Examiner* — Brian Young

(57) ABSTRACT

A system and method for detecting and correcting large errors during ADC operation. The system includes an ADC; an AAF at the input of the ADC, having bandwidth less than information bandwidth of the ADC; and a large-error detection and correction processing unit at the output of the ADC. The large-error detection and correction circuit includes an interpolation filter to determine values of predicted digital samples corresponding to actual digital samples in a sequence of digital samples from the ADC based on information from neighboring digital samples. A signal-delay circuit in parallel with the interpolation filter delays the actual digital samples by an amount of a lag from the interpolation filter. An adder determines differences between the predicted and actual digital samples, a matched filter detects a pattern of the differences, and a large-error detection processing unit determines whether a large error occurs based on the pattern of the differences.

18 Claims, 15 Drawing Sheets

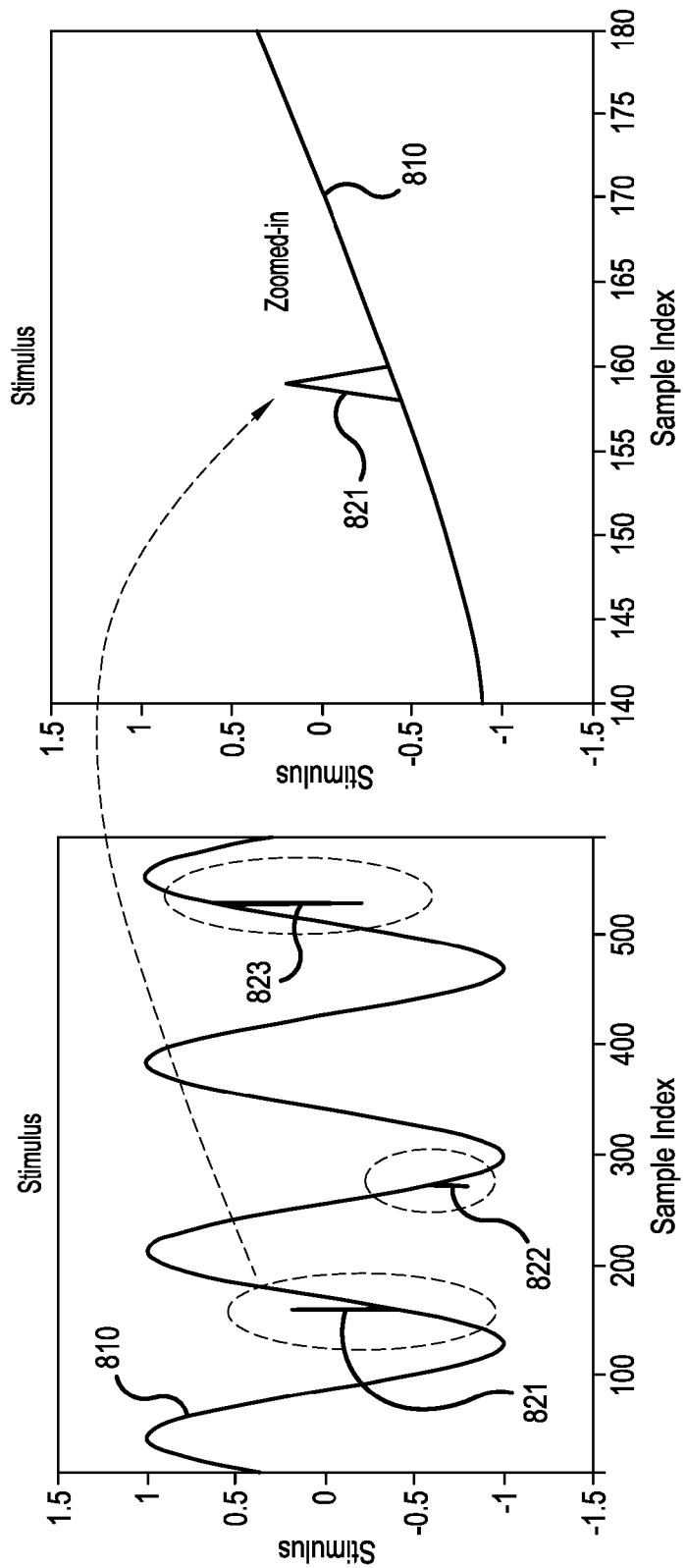

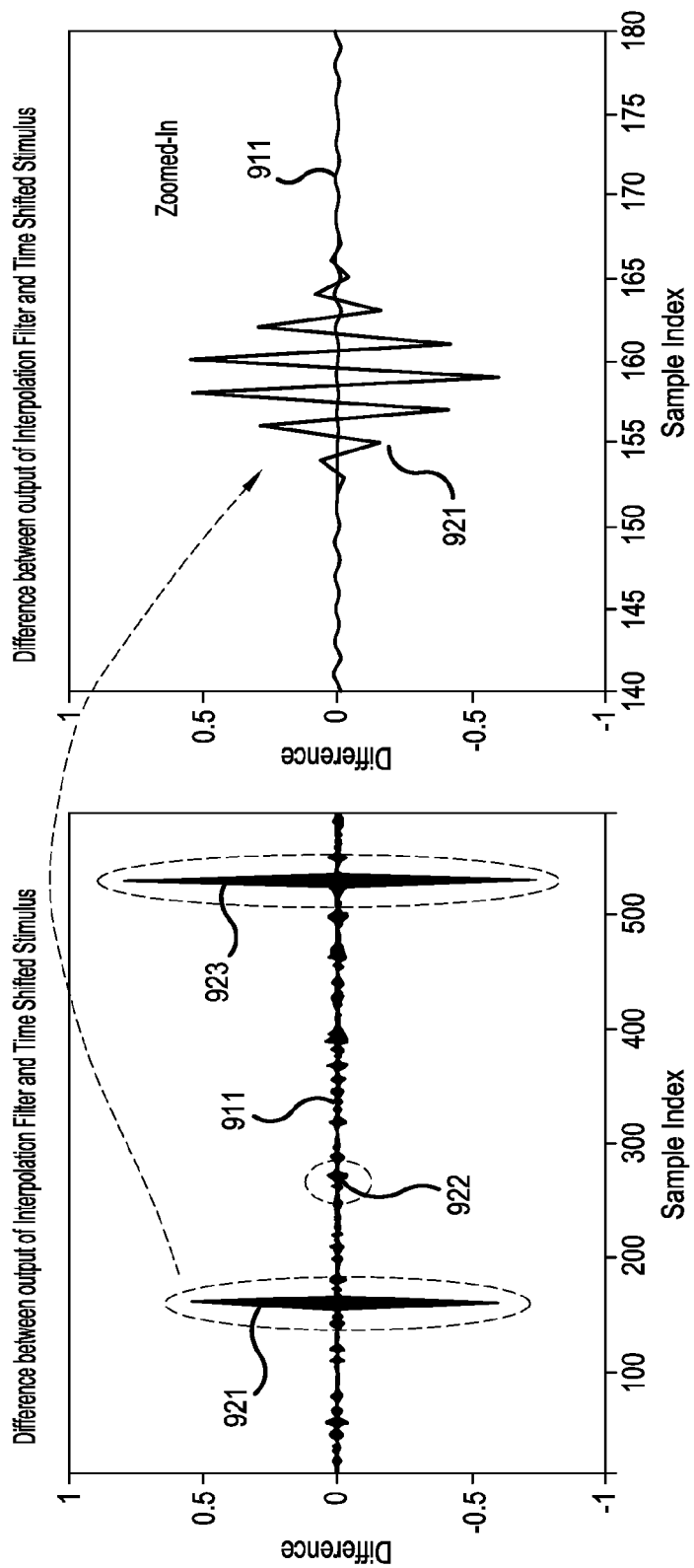

LARGE-ERROR DETECTION AND CORRECTION OF DIGITAL SAMPLE SEQUENCE FROM ANALOG-TO-DIGITAL CONVERTER

BACKGROUND

Analog to digital converters (ADCs) are used for proper operation of conventional wireless communications, enabling digital processing of analog input signals. A principle building block of an ADC is a comparator. FIG. 1 is a simplified block diagram of a basic implementation of a conventional comparator 100, which includes of two inputs 110 and 120, an output 130, and a clock 140. The input 110 receives an input signal (e.g., a radio frequency (RF) signal), and the input 120 receives a reference signal to be compared to the input signal. The output 130 takes one of two possible Boolean logic values of the inputs 110 and 120, discussed below. The clock 140 with a chosen edge (e.g., the rising edge) defines the time instant the comparator 100 is sensitive to the comparison inputs 110 and 120, and is expected to make a decision. The output 130 can be one of two stable states: (i) logic TRUE (or 1) when the input signal at the input 110 is greater than the applied reference at the input 120, or (ii) logic FALSE (or 0) when the input signal at the input 110 is less than the applied reference at the input 120. The output of an ideal comparator is not defined when the input is exactly equal to the reference. However, as a practical matter, the comparator 100 does not take on one of the two allowed logic states, logic 0 or logic 1, for such an input condition, but rather will remain in an indeterminate state, called a metastable state, until additional stimulus, like a noise event, causes an imbalance which pushes the comparator 100 out of the metastable state toward one of logic 0 or logic 1.

Practical regenerative comparators are typically implemented using active circuit elements, such as transistors, in positive feedback configuration. FIG. 2 is a simplified circuit diagram of a conventional regenerative comparator 200 having multiple active circuit elements. The comparator 200 includes cross-coupled transistors 211, 212, 213 and 214, and cross-coupled nodes $n_1$ and $n_2$, which develop an initial starting voltage, called the "seed voltage," that depends on the input voltage at input 210, and the reference voltage at input 220. The comparator 200 further includes output 230 and clock 240.

FIG. 3 is a graph showing curve 312 indicating the transfer function of the latch from nodes $n_1$ to $n_2$, and curve 321 indicating the transfer function of the latch from nodes $n_2$ to $n_1$. The three points at which the two curves 312 and 321 of the respective transfer functions intersect are the solutions of the circuit, i.e., the possible states. There are two stable states, logic 1 and logic 0, and one metastable state (respectively marked by circles). The rising edge of the clock 240 triggers the comparator 200 and the cross-coupled nodes $n_1$ and $n_2$ settle towards one of the two stable states following a regenerative exponential trajectory until the final logic states are achieved.

The rate at which the comparator 200 regenerates, called the "regeneration time constant," depends on the process technology used and the architecture of the comparator 200, for example. The comparator output 230 reaches final logic thresholds sooner for large input seed voltages than for small input seed voltages. That is, for small input seed voltages, the comparator output 230 takes longer to regenerate. When an input seed voltage is zero (metastable state), the comparator 200 theoretically stays at the metastable point until an additional event, such as thermal noise imbalance, is enough to push the output 230 to one of the valid logic states, logic 1 or logic 0.

The illustrative comparator 200 can additionally be characterized by the delay from the clock edge until the time the outputs are large enough (usually the noise margin of the logic family). FIG. 4 is a graph showing curve 405 indicating time required to reach a valid logic state versus the difference between the input and the reference voltages. An ADC operates on the inputs that can be different once every clock event. The comparator 200, therefore, has at the most a clock period or a portion of a clock period to make a valid logic decision. When the comparator 200 in an ADC is in a metastable state, a valid logic decision cannot be inferred within the available time, causing an error condition. Arrow 412 indicates the set of voltages that resolve to valid logic levels within available regeneration time. Arrow 411 indicates the set of voltages that do not resolve to valid logic levels within the available time. These are inputs that may cause metastable errors. Arrow 413 indicates the available regeneration time.

An input that causes the comparator 200 in an ADC to be metastable results in a digital output that does not match corresponding portion(s) of the analog input signal, resulting in error. When this error is treated as a noise event, it is observed that such metastable events appear as very large noise-like events that would be highly improbable with the Gaussian statistical models that are usually associated with electronic circuit noise. FIG. 5 is a graph showing curves indicating probability of error versus magnitude of error around desired output. In particular, curve 505 indicates circuit noise predicted by Gaussian statistics, and curve 515 indicates noise due to metastable errors. The dashed portion 515' of curve 515 beneath curve 505 indicates metastable errors that are indistinguishable from the circuit noise predicted by Gaussian statistics.

In addition to the signal-to-noise ratio (SNR) and/or noise spectral density (NSD), it is increasingly common for ADCs also to be characterized with a metastable error rate. The metastable error rate may be defined as the probability of the ADC generating a noise event larger than expected from a Gaussian statistical model, and is indicated by the shaded area 517, beneath the curve 515 extending beyond the curve 505 in FIG. 5. The shaded area 517 depicts the noise due to metastable errors or other long-tail noise event. The relative importance of the metastable error rate metric depends on the system under consideration. As an example, in many digital communication systems, a metastable error can cause a symbol detection error, but this may be mitigated by recovering the intended message through error correction coding techniques that are usually part of such systems. In a worst case scenario, the receiver comprising the ADC may request a retransmission if the received message cannot be recovered. ADCs used in such systems typically can have poor metastable error rates, often many times in an hour. On the other hand, an ADC used in instrumentation, or aerospace and defense applications, may be used to monitor improbable or infrequent events, and it often may not be possible to repeat the experiment or observation or communication. Such ADCs are designed for lower metastable error rates, such as once per month or once per year, for example.

For example, a metastable error in an ADC used in an oscilloscope with digital triggering may cause the instrument to trigger incorrectly. That is, a metastable error may create a large error exceeding a predetermined trigger level in the oscilloscope even though the actual signal being digitized and monitored by the oscilloscope has not exceeded the predetermined trigger level, resulting in a premature or otherwise incorrect trigger. Another example is a digitizer measuring data from an experiment over a very long duration in "peak hold" mode or "single shot" mode. A metastable error might destroy the outcome of the experiment.

Accordingly, there is a need for a system and method that keeps the metastable error rate sufficiently low, particularly in mission critical systems. This may be achieved through a combination of the metastable error rate specification of the ADC being used, and other system level implementations such as using redundant hardware, examples of which are described by Keane, U.S. Pat. No. 8,736,479 (issued May 27, 2014), which is hereby incorporated by reference.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

FIGS. 8A and 8B are graphs showing a simulated sinusoidal input stimulus (analog input signal) with metastable errors versus sample index, including zoomed-in view, according to a representative embodiment.

FIGS. 9C and 9D are graphs showing the difference between the output of an interpolation filter in FIG. 6 and a time-shifted input stimulus, including zoomed-in view, according to a representative embodiment.

DETAILED DESCRIPTION

Figure 1:
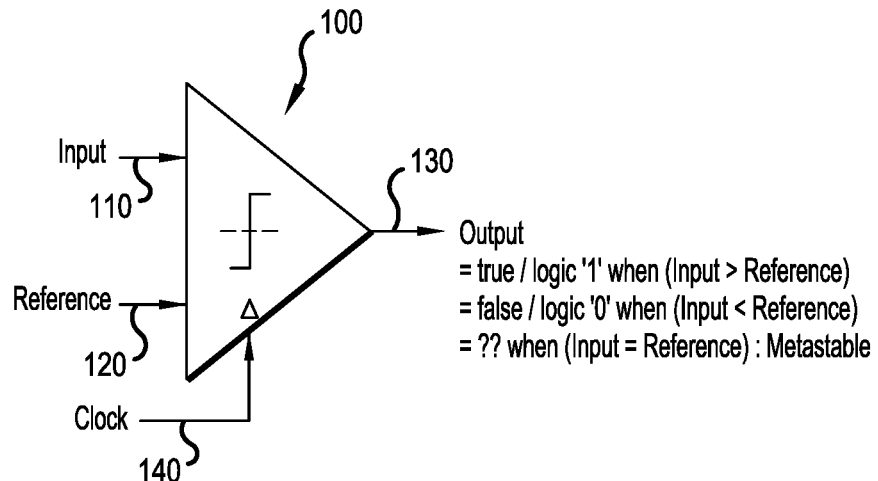
FIG. 1 is a simplified block diagram of a basic implementation of a conventional comparator.
Figure 2:
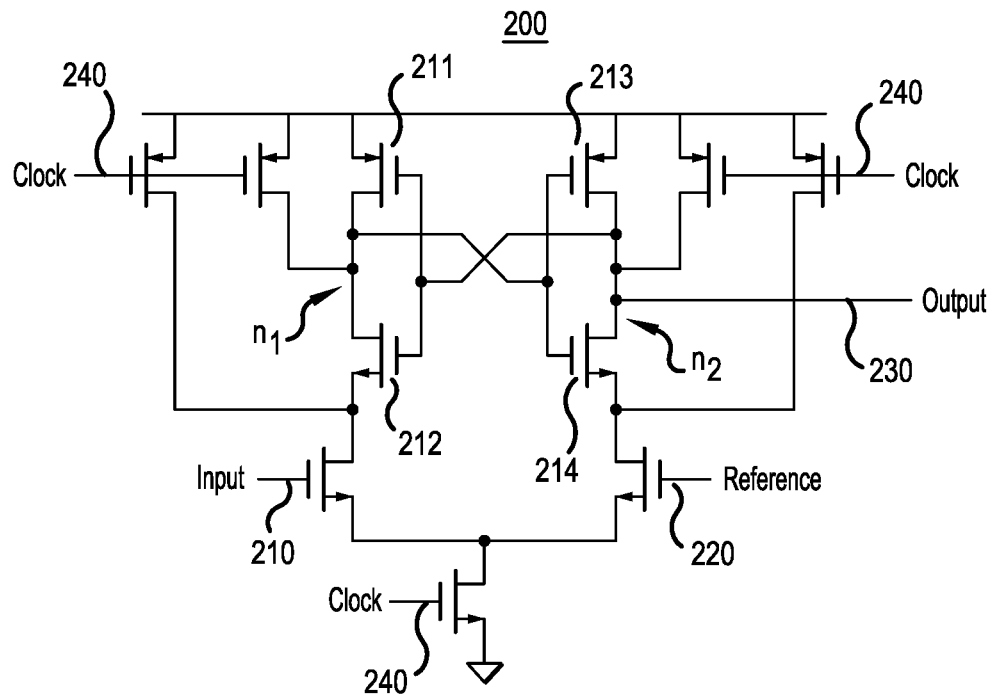
FIG. 2 is a simplified circuit diagram of a conventional regenerative comparator having multiple active circuit elements.
Figure 3:
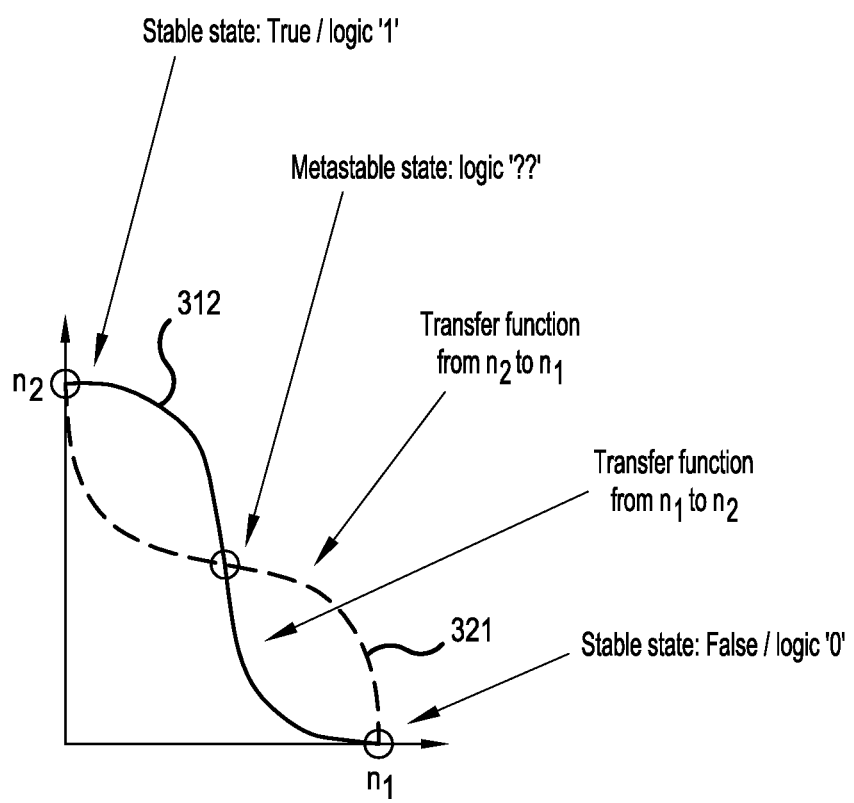
FIG. 3 is a graph showing curves indicating the transfer functions between the two internal nodes in the latch of a conventional regenerative comparator.
Figure 4:
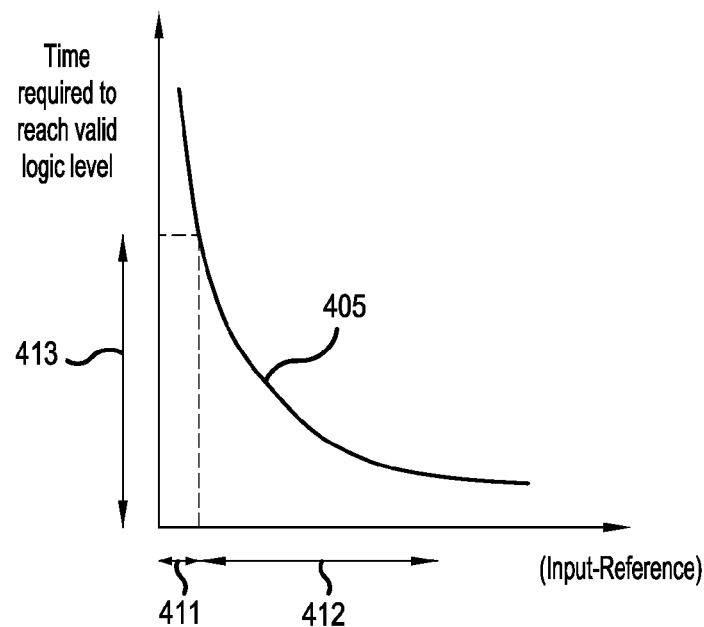
FIG. 4 is a graph showing a curve indicating time required for a conventional comparator to reach a valid logic state versus the difference between the input and the reference voltages.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Generally, according to various embodiments, a system and method detect and correct large errors (such as metastable errors) during operation of a system (such as an ADC or receiver comprising an ADC) for converting analog input signals to digital output signals that has an upstream bandwidth-limiting mechanism (such as an analog anti-alias filter (AAF)).

According to a representative embodiment, a system for detecting and correcting large errors during an analog-to-digital conversion operation includes an ADC, an analog anti-alias filter (AAF) and a large-error detection and correction processing unit. The ADC is configured to convert an analog input signal, received at an input of the ADC, into a sequence of digital samples at predetermined time intervals. The AAF is at the input of the ADC, and has a bandwidth less than an information bandwidth of the ADC, thereby limiting a functional bandwidth of the ADC. The large-error detection and correction processing unit is at an output of the ADC, and includes at least an interpolation filter, a signal-delay circuit, an adder, a matched filter and a large-error detection processing unit. The interpolation filter is configured to determine values of predicted digital samples corresponding to actual digital samples in the sequence of digital samples from the ADC based on information from one or more neighboring digital samples, respectively, in the sequence of digital samples, where the neighboring digital samples include representations of the analog input signal and fundamental inherent noise due to physical properties of the system. The signal-delay circuit is connected in parallel with the interpolation filter and configured to delay the actual digital samples in the sequence of digital samples by an amount equal to a lag resulting from the interpolation filter determining the values of the predicted digital samples, respectively. The adder is configured to determine differences between the predicted digital samples from the interpolation filter and the corresponding actual digital samples from the delay circuit, respectively. The matched filter is configured to detect a pattern of the differences between the predicted digital samples and the actual digital samples. The large-error detection processing unit is configured to determine whether a large error occurs in the sequence of digital samples based on the pattern of the differences between the predicted and actual digital samples.

According to another representative embodiment, a method is provided for detecting and correcting large errors during operation of a system for converting analog input signals to digital output signals, the system including an ADC and an upstream bandwidth-limiting device. The method includes converting an analog input signal received from the upstream bandwidth-limiting device into a sequence of actual digital samples at predetermined time intervals; characterizing properties of fundamental inherent noise due to physical properties of the system, the fundamental inherent noise including one or more of thermal noise, shot noise and flicker noise; determining values of predicted digital samples corresponding to the actual digital samples in the sequence of digital samples based on information from one or more neighboring digital samples, respectively, where the neighboring digital samples include representations of the analog input signal and the fundamental inherent noise due to physical properties of the system; comparing the predicted digital samples with corresponding actual digital samples and detecting a pattern of differences between the compared predicted digital samples and the corresponding actual digital samples using matched filter; and determining whether a large error has occurred based on the pattern of differences between the predicted and the corresponding actual digital samples detected by the matched filter. It is determined that a large error has occurred when a difference between the predicted digital samples and the corresponding actual digital samples of the sequence of digital samples exceeds a predetermined threshold of the fundamental inherent noise within the system.

Figure 6:
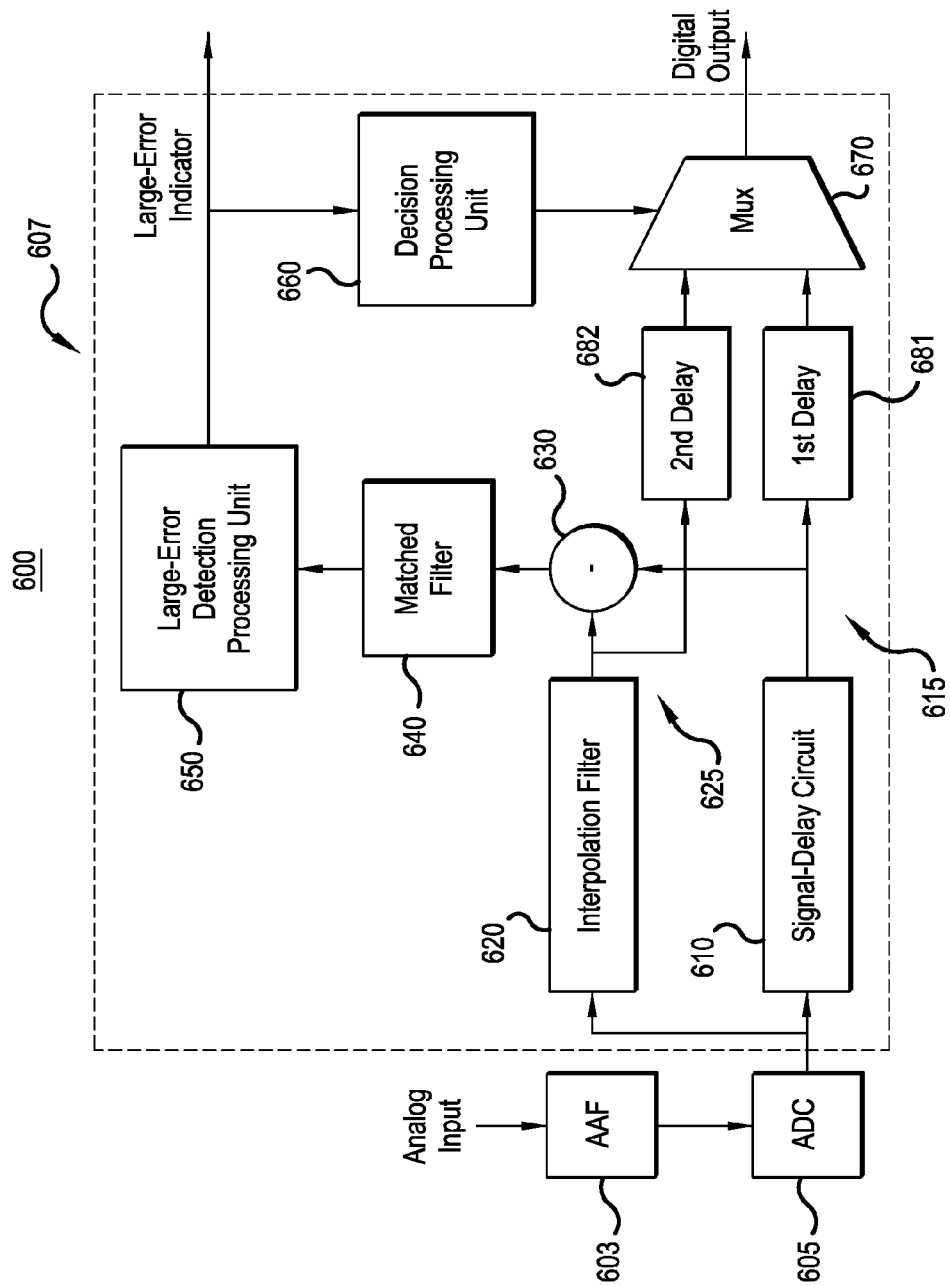
FIG. 6 is a simplified block diagram of a system for detecting and correcting large errors when converting analog input signals to digital signals, according to a representative embodiment.

FIG. 6 is a simplified block diagram of a system for detecting and correcting large errors when converting analog input signals to digital signals, according to a representative embodiment.

Referring to FIG. 6, system 600 includes an analog-to-digital converter (ADC) 605 and an analog anti-alias filter (AAF) 603, or other bandwidth-limiting device, upstream from the ADC 605. That is, the AAF 603 has a bandwidth less than an information bandwidth of the ADC 605, thereby limiting a functional bandwidth of the ADC 605. In the depicted embodiment, the AAF 603 receives an analog input signal, and outputs the filtered analog input signal to the input of the ADC 605. The ADC 605 converts the analog input signal received at its input into a sequence of digital samples at predetermined time intervals. In an embodiment, the information bandwidth of the ADC comprises a Nyquist bandwidth.

The system 600 further includes a large-error detection and correction circuit 607 at the output of the ADC 605. The large-error detection and correction circuit 607 is instantiated downstream of the ADC 605, prior to any subsequent digital signal processing, such as digital frequency translation or decimation filtering. The various illustrative embodiments described herein assume that the AAF 603 is a low-pass filter, and thus subsequent digital interpolation filter 620 (discussed below) is a low-pass filter having low-pass transfer characteristics. Also, the various embodiments will work with the ADC 605 and an upstream band-pass AAF (e.g., in a system used to acquire signals from higher Nyquist zones), and thus the interpolation filter 620 is a band-pass filter. That is, for optimal metastable error detection sensitivity, the interpolation filter 620 for such cases may be designed with appropriate low-pass to band-pass transformations, respectively, although other types of filters may be incorporated, such as band-pass filters, without departing from the scope of the present teachings.

In the depicted embodiment, the large-error detection and correction circuit 607 includes digital interpolation filter 620 and a signal-delay circuit 610 connected in parallel with the interpolation filter 620. The signal-delay circuit 610 is in a first signal path 615, which also includes a first delay circuit 681, and the interpolation filter 620 is in a second signal path 625, which also includes a second delay circuit 682, discussed below. The interpolation filter 620 is configured to predict values of digital samples (predicted digital samples) corresponding to actual digital samples in the sequence of digital samples from the ADC 605. Stated differently, the interpolation filter 620 determines values of predicted digital samples corresponding to the actual digital samples in the sequence of digital samples. The predicted digital samples are based on information from one or more neighboring digital samples, respectively, in the sequence of digital samples. The neighboring digital samples include representations of the analog input signal and fundamental inherent noise due to physical properties of the system. For example, the fundamental inherent noise may include thermal noise, shot noise and flicker noise due to the physical properties of the system 600, including the AAF 603 and ADC 605.

Figure 7A:
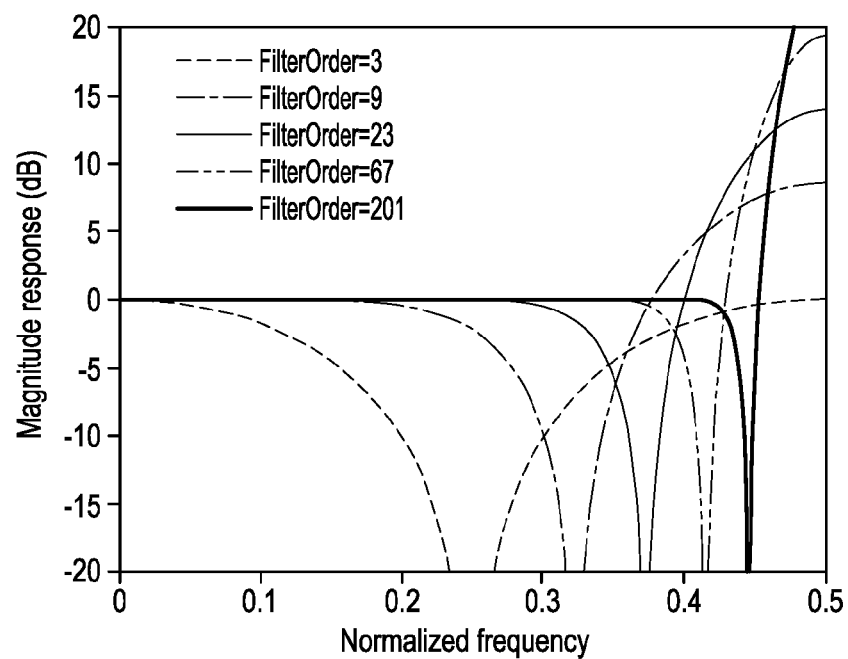
FIG. 7A is a graph showing magnitude of frequency response of an interpolation filter in FIG. 6 versus normalized frequency, according to a representative embodiment.

An illustrative low-pass implementation of the interpolation filter 620 is similar to that used in the skip-and-fill method proposed by Moon et al., "Background digital calibration techniques for pipelined ADCs," IEEE TCAS II, vol. 44, no. 2, pp. 102-109 (February 1997), which is hereby incorporated by reference. FIG. 7A is a graph showing frequency response of a representative interpolation filter 620 of various orders with low-pass characteristics as magnitude response (dB) versus frequency normalized to the ADC sampling frequency (Fs) of the ADC 605. These filters are non-causal symmetric filters with a zero response at zero lag, and can be practically realized in a causal manner simply by delaying the output by an appropriate amount. Notably, increasing the number of taps/order of the interpolation filter 620 causes a longer lag, but allows a broader operating range.

Figure 7B:
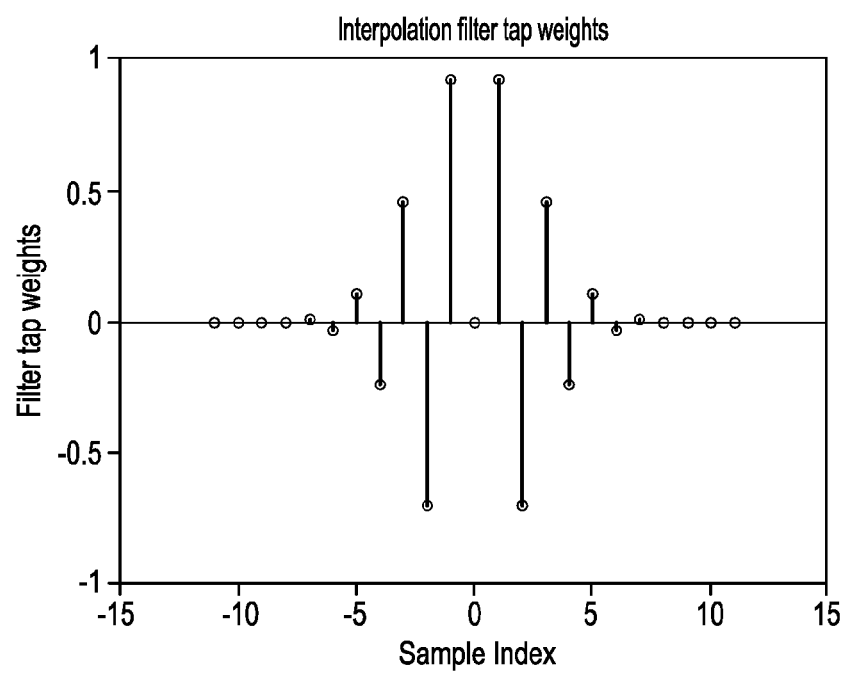
FIG. 7B is a graph showing filter tap weights of an interpolation filter in FIG. 6 versus a sample index, according to a representative embodiment.

The signal-delay circuit 610 is configured to delay the actual digital samples in the sequence of digital samples received from the ADC 605 by an amount equal to a lag resulting from the interpolation filter 620 interpolating the values of the predicted digital samples, respectively. For purposes of illustration, the interpolation filter 620 may be assumed to be a $23^{rd}$ order filter, for example. FIG. 7B is a graph showing filter tap weights of the interpolation filter 620 in FIG. 6 versus a sample index. More particularly, FIG. 7B shows the impulse response of the $23^{rd}$ order filter, filter tap weight versus sample indices. In this case, the output of the interpolation filter 620 will be delayed by 12 samples (Lag=L1) when implemented in a causal realizable form. The actual digital samples from the first signal path 615 have to be delayed by 12 samples to align the output of the interpolation filter 620 with the unfiltered samples output from the signal-delay circuit 610.

An adder 630 (or subtracting circuit) receives the outputs of the signal-delay circuit 610 and the interpolation filter 620. The adder 630 determines differences between the values of the predicted digital samples from the interpolation filter 620 and the values of the actual digital samples from the signal-delay circuit 610, respectively. That is, the unfiltered actual digital samples from the signal-delay circuit 610 are subsequently subtracted from the output of the interpolation filter 620. Since the metastable error (or other large error) generated by the ADC 605 is typically a one sample wide impulse, for example, the adjacent actual digital samples from the ADC 605 are not disturbed.

The large-error detection and correction circuit 607 further includes a matched filter 640, a large-error detection processing unit 650 and a decision processing unit 660. The matched filter 640 is configured to detect a pattern of the differences, output by the adder 630, between the predicted values of the noise-free digital samples and the actual values of the digital samples. The large-error detection processing unit 650 is configured to determine whether a large error (e.g., a metastable error) occurs in the sequence of digital samples based on the pattern of the differences between the predicted and actual digital samples detected by the matched filter 640. In an embodiment, the matched filter 640 has an impulse response that is a complex conjugate time-reversed version of the detected difference pattern, discussed below. That is, the large-error detection processing unit 650 detects when a large error(s) occurs in the sequence of digital samples, and outputs a large-error indicator in response. The large-error indicator may be a trigger, a flag and/or a status bit, for example. The decision processing unit 660 is configured to receive the large-error indicator from the large-error detection processing unit 650 when the large-error detection processing unit 650 determines that a large error has occurred, and to output a control signal for controlling a digital output of the large-error detection and correction circuit 607 in response (via multiplexer 670), as discussed below.

The large-error detection and correction circuit 607 further includes a multiplexer (Mux) 670, a first delay circuit 681 and a second delay circuit 682. The multiplexer 670 is configured to receive the actual digital samples from the signal-delay circuit 610 and the first delay circuit 681 via the first signal path 615, and to receive the respective predicted digital samples from the interpolation filter 620 and the second delay circuit 682 via the second signal path 625. The multiplexer 670 also receives a control signal from the decision processing unit 660, and outputs a selected one of the actual digital sample and the respective predicted digital sample in response to the received control signal for each digital sample output by the ADC 605. In particular, the control signal from the decision processing unit 660 causes the multiplexer 670 to output the respective predicted digital samples, in response to the decision processing unit 660 receiving a large-error indicator from the large-error detection processing unit 650. Otherwise, the control signal from the decision processing unit 660 causes the multiplexer 670 to output the actual digital samples of the sequence of digital samples (i.e., when no large-error indicator is received by the decision processing unit 660).

In other words, the large-error detection and correction circuit 607 outputs via the multiplexer 670 the actual digital samples of the sequence of digital samples from the ADC 605 when no large error is detected, and the predicted digital samples corresponding to the actual digital samples when a large error (e.g., metastable error) is detected. In an embodiment, the output of the large-error detection and correction circuit 607 may switch from the actual digital samples to the predicted digital samples during the time period when a large error is detected, and then switch back to the actual digital samples when the large error is no longer detected. In various embodiments, the control signal from the decision processing unit 660 (and the corresponding digital output of the large-error detection and correction circuit 607) may be application specific, the determination of which may be implemented by the decision processing unit 660. That is, when the decision processing unit 660 receives the large-error indicator from the large-error detection processing unit 650 (when the large-error detection processing unit 650 determines that a large error has occurred in the sequence of digital samples), it applies an application specific algorithm to determine whether to correct the large error (e.g., by controlling the multiplexer 670 to output the predicted digital samples) or to have the large-error detection processing unit 650 simply pass the large-error indicator to downstream error handling routine (not shown), in accordance with the application specific algorithm. When the application specific algorithm provides for correction of the large error, the decision processing unit 660 controls the multiplexer 670 to output the respective predicted digital samples received via the second signal path 625, as discussed above. In an embodiment in which the large errors are always simply detected, but not corrected, the decision processing unit 660 is not required.

The first delay circuit 681 in the first signal path 615 between the signal-delay circuit 610 and the multiplexer 670 is configured to delay the actual digital samples in the first signal path 615 by an amount equal to a lag resulting from the matched filter 640 detecting the difference pattern, the large-error detection processing unit 650 determining whether a large error occurs in the sequence of digital samples, and the decision processing unit 660 providing a control signal to the multiplexer 670. Likewise, the second delay circuit 682 in the second signal path 625 between the interpolation filter 620 and the multiplexer 670 is configured to delay the respective predicted digital samples (corresponding to the actual digital samples in the first signal path) by the amount of the lag resulting from the matched filter 640 detecting the difference pattern, the large-error detection processing unit 650 determining whether a large error occurs in the sequence of digital samples, and the decision processing unit 660 providing the control signal to the multiplexer 670. As discussed above, when the decision processing unit 660 receives a large error indicator from the large-error detection processing unit 650, the decision processing unit 660 provides a control signal that causes the multiplexer 670 to output the predicted digital samples; otherwise, the decision processing unit 660 provides a control signal that causes the multiplexer 670 to output the actual digital samples.

Figure 5:
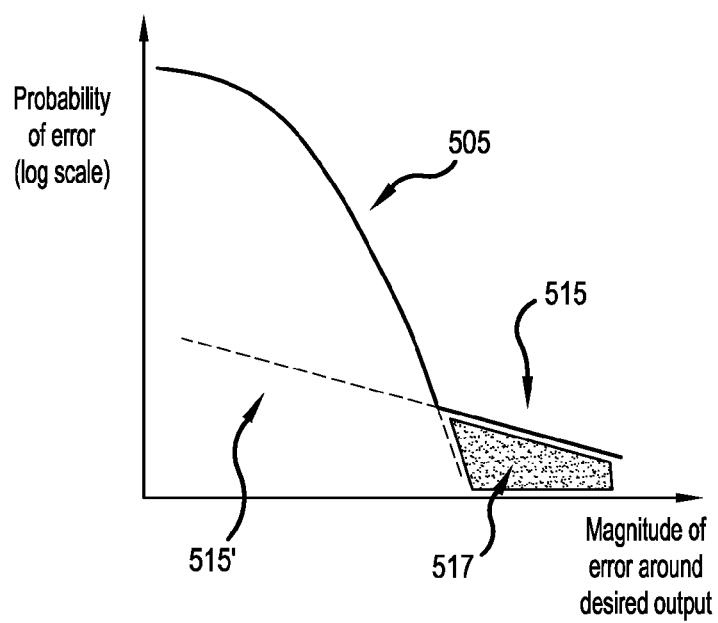
FIG. 5 is a graph showing curves indicating probability of error versus magnitude of error around desired output for a conventional comparator.
Figure 8D:
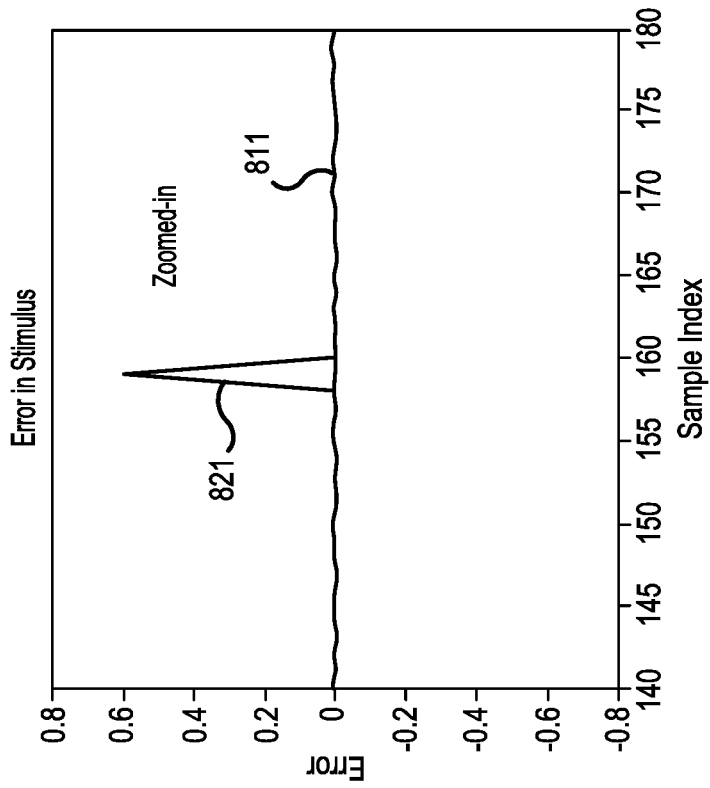
FIGS. 8C and 8D are graphs showing error magnitude with metastable errors versus sample index, including zoomed-in view, according to a representative embodiment.
Figure 8C:
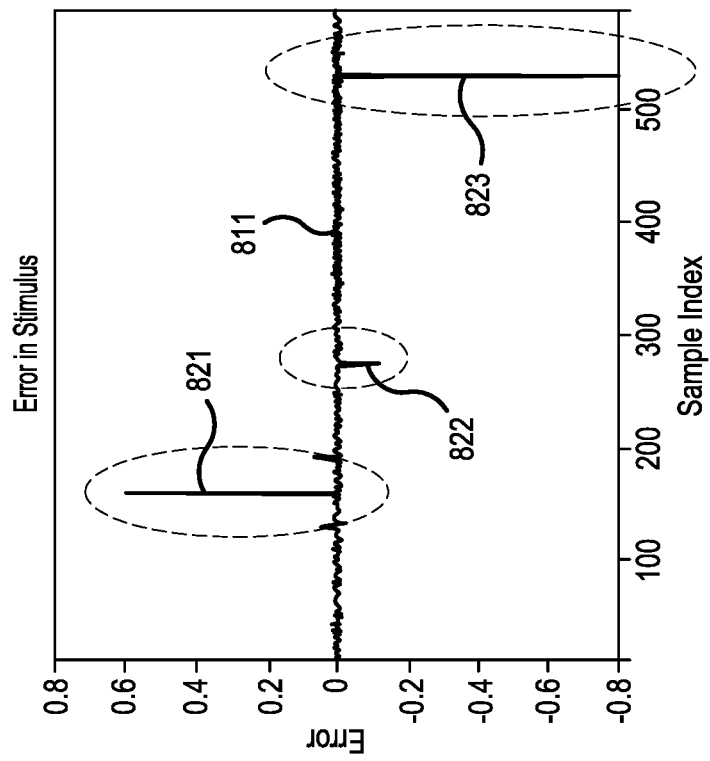

For purposes of illustration, examples of functionality of the large-error detection and correction circuit 607 is discussed below using simulated analog input signals, and digital output from the ADC 605. For instance, FIGS. 8A to 8D show a simulation with a sinusoidal input stimulus 810 in FIG. 8A and additive white Gaussian noise 811 in FIG. 8C with standard deviation of 0.004 to simulate a 45 dB SNR data stream. In the depicted example, additional quantization noise is not being simulated for simplification. Three metastable errors 821, 822 and 823 (errors) are introduced, indicated by vertical spikes within dashed circles in FIGS. 8A and 8C. As shown, the metastable errors 821, 822 and 823 may have positive or negative polarity. In particular, the metastable errors 821 and 823 introduced at sample indexes 159 and 529 are large errors, and the metastable error 822 introduced at sample index 271 is a small error with magnitude equal to 10 times the standard deviation of noise. Notably, if the magnitude of the small metastable error 822 were to fall on the dashed portion 515' of curve 515 in FIG. 5 (indicating noise due to metastable errors), it would be effectively indistinguishable from the circuit noise predicted by Gaussian statistics, and thus not identified or otherwise treated as a large error in the present embodiment. The threshold separating large from small errors (metastable or otherwise) may be set by a user. The added metastable errors 821, 822 and 823 degrade the SNR to around 25 dB. FIGS. 8B and 8D respectively show the metastable error 821 in the stimulus 810 as a zoomed-in version for clarity of detail.

Figures 9A, 9B:
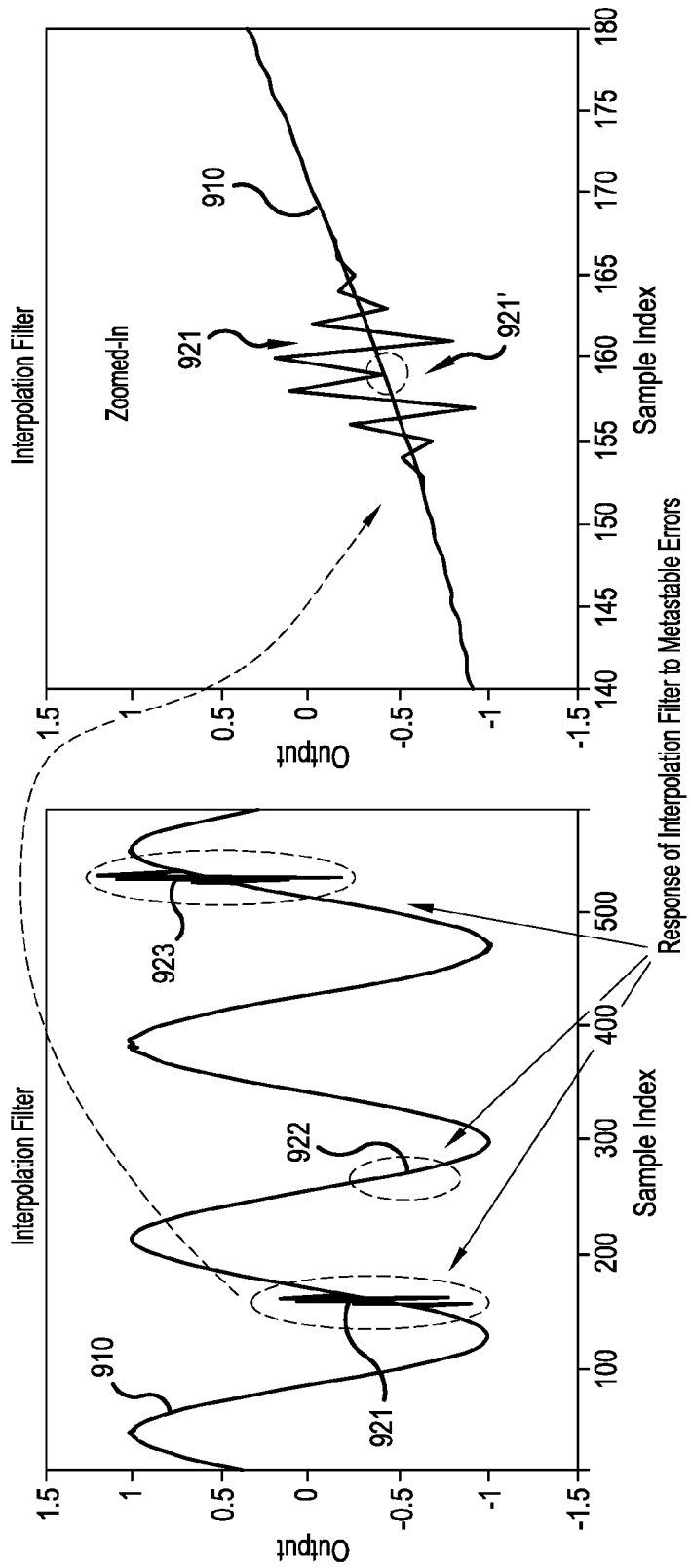
FIGS. 9A and 9B are graphs showing the output of an interpolation filter in FIG. 6 in response to the input stimulus, including zoomed-in view, according to a representative embodiment.

The interpolation filter 620 (with an impulse response $h_1[n]$ having a corresponding transfer function $H_1(z)$) predicts a value of the current digital sample as a function of neighboring (e.g. adjacent) samples without knowledge of the current digital sample, where n indicates the discrete-time sample index and z indicates the discrete-time frequency variable. With respect to occurrence of a metastable error, the interpolation filter 620 will predict the value of the current digital sample, but the response of the interpolation filter 620 will show a shape similar to an impulse response around the current digital sample. FIGS. 9A to 9D show illustrative responses of the interpolation filter 620 to the metastable errors 821, 822 and 823, indicated by impulse response signatures 921, 922 and 923, respectively. In particular, FIGS. 9A and 9B show output 910 of the interpolation filter 620 in response to the sinusoidal input stimulus 810. As apparent in FIG. 9B, the output 910 of the interpolation filter 620 shows a characteristic signature 921 around the sample with the metastable error 821 in the input stimulus, which is the impulse response of the interpolation filter 620. The interpolation filter 620 thus predicts value of the digital sample if there were no metastable error, indicated by the dashed circle 921' in FIG. 9B.

For ease of explanation, the lag through the interpolation filter 620 is not shown in FIGS. 9A to 9D, and all waveforms are time shifted to align with the input stimulus 810. That is, FIGS. 9A and 9B show the output of the interpolation filter 620 (output 910), and FIGS. 9C and 9D show Gaussian noise 911 based on the difference between the output of the interpolation filter 620 and the time-shifted input stimulus. Subtracting the delayed version of the input stimulus (with the metastable errors 821, 822 and 823) from the output of the interpolation filter 620 indicates a large difference due to the metastable error, as shown in FIGS. 9C and 9D, for example.

Referring to the impulse response signature 921, in particular, the metastable error at this digital sample instant may be detected by searching for the peaks. However, it is possible to make a more sensitive measurement by hunting for this signature pattern, e.g., shown in FIG. 9D, using the matched filter 640 (with an impulse response $h_2[n]$ having a corresponding transfer function $H_2(z)$), based on the difference between the predicted digital sample output by the interpolation filter 620 and the signal-delay circuit 610, as discussed above. An illustrative matched filter 640 has an impulse response that is a complex conjugate time-reversed version of the difference pattern being detected. Since the difference pattern being searched is symmetric and real, a possible matched filter 640 looks exactly like the difference between the output of the interpolation filter 620 and the delayed input. The tap weights of the matched filter 640 resemble the impulse response of the interpolation filter 620 with a −1 instead of a 0 at zero lag. Notably, since the output of the matched filter 640 is used only in detecting the metastable error of the current sample, and is not used to substitute the current sample, filter tap coefficients with smaller bit widths may be used in the matched filter 640. In addition, it is also possible to reduce hardware by windowing the matched filter 640 to reduce the number of taps.

Figures 10A, 10B:
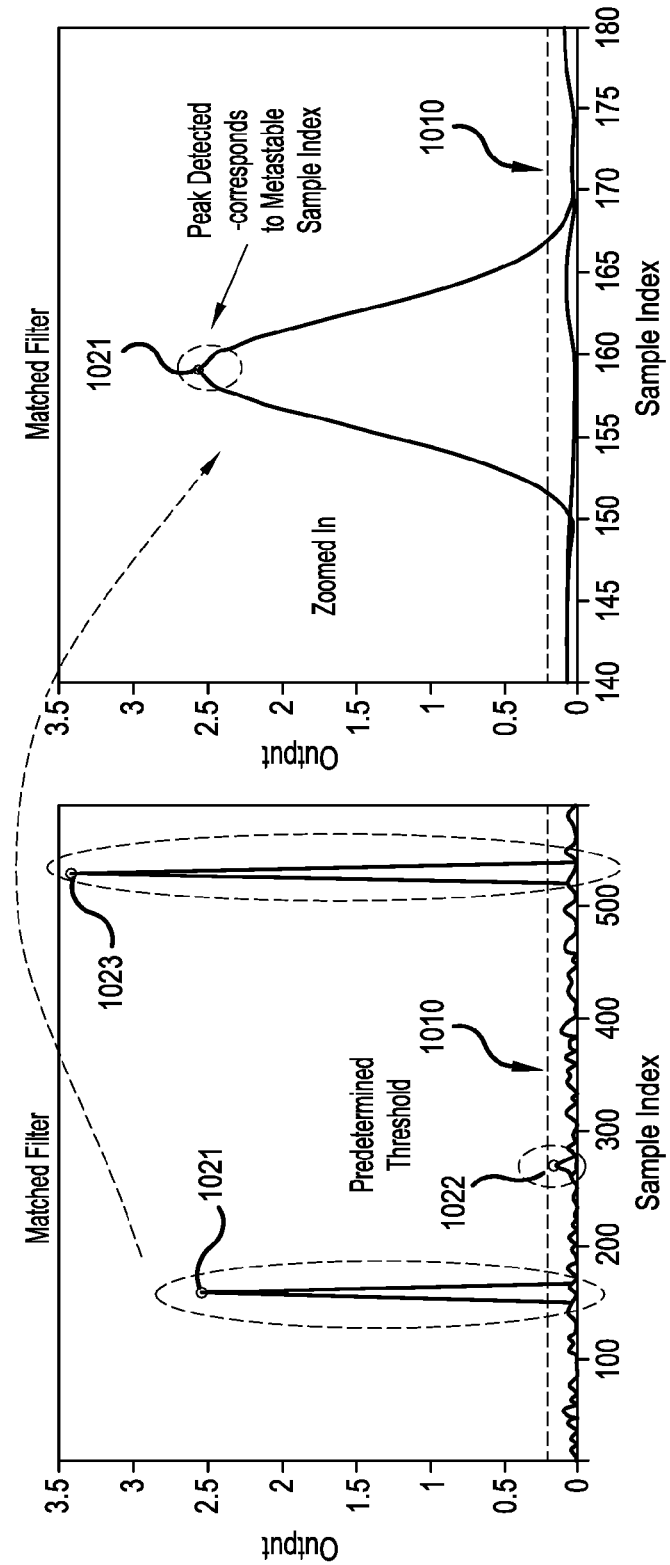
FIGS. 10A and 10B are graphs showing illustrative peaks output by a matched filter in FIG. 6 in response to impulse responses signatures, including zoomed-in view, according to a representative embodiment.

The output of the matched filter 640 includes peaks that correspond to the time instants of the metastable error digital sample. A simple example of a metastable error detection algorithm may be a function that searches for peaks in the output of the matched filter 640 that exceed a predetermined (e.g., user-programmed) threshold 1010, as shown in FIGS. 10A and 10B. That is, FIGS. 10A and 10B show illustrative peaks 1021, 1022 and 1023 output by the matched filter 640 in response to the impulse response signatures 921, 922 and 923, respectively, where FIG. 10B is the zoomed-in depiction of the peak 1021. A predetermined threshold 1010 may be used to change the sensitivity of the matched filter 640 to the size of metastable errors being sensed. Multiple predetermined thresholds may be used by the matched filter 640 for more complex functionality. For example, a predetermined threshold may be used to detect metastable errors, while another predetermined threshold may be used to detect and correct metastable errors. Also, in various embodiments, information specific to the architecture of the ADC 605 used in the system 600 may be built or programmed into the large-error detection processing unit 650. For example, when a comparator in the most significant stage of the (pipelined) ADC 605 is metastable, the expected error magnitude, as well as a set of codes around which the correct code is expected to be, may be determined. Accordingly, the large-error detection processing unit 650 may be configured to implement rules specific to making better detections of the metastable errors, based on the expected error magnitude and the corresponding set of codes.

Figures 11A, 11B:
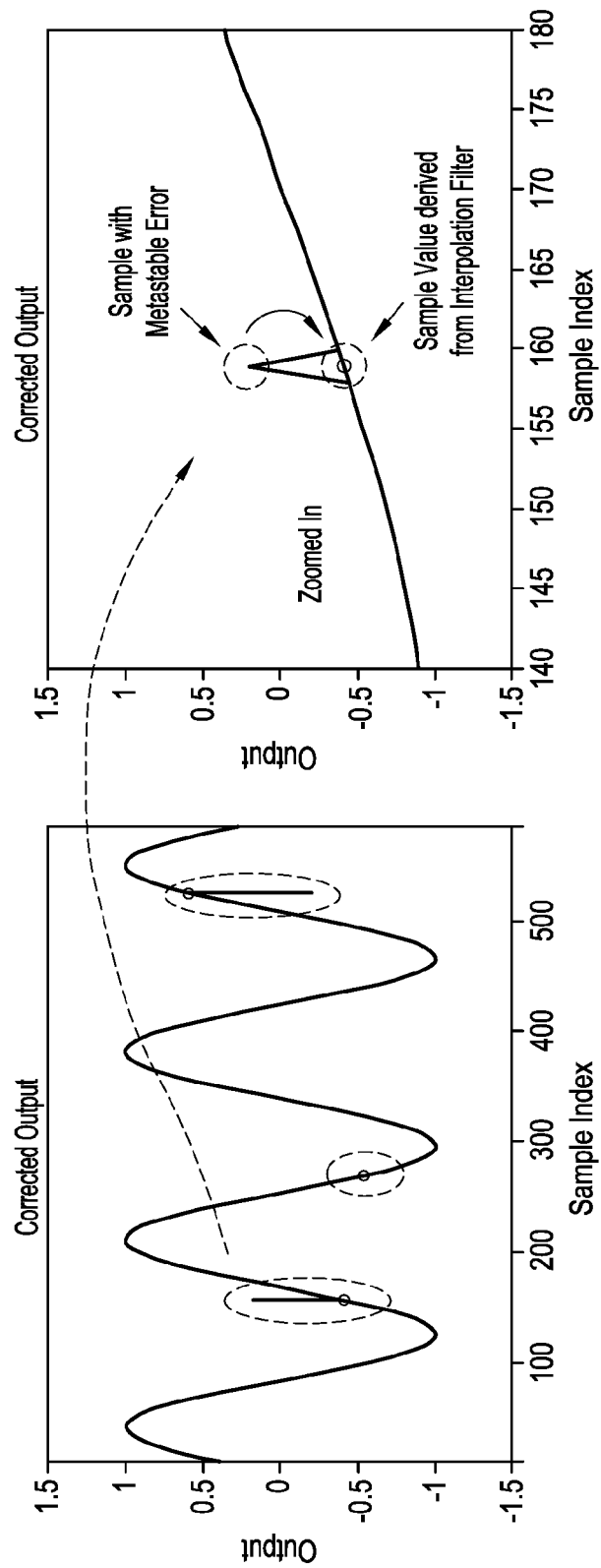
FIGS. 11A and 11B are graphs showing the corrected output of a large-error detection and correction circuit in FIG. 6, including zoomed-in view, according to a representative embodiment.
Figures 11C, 11D:
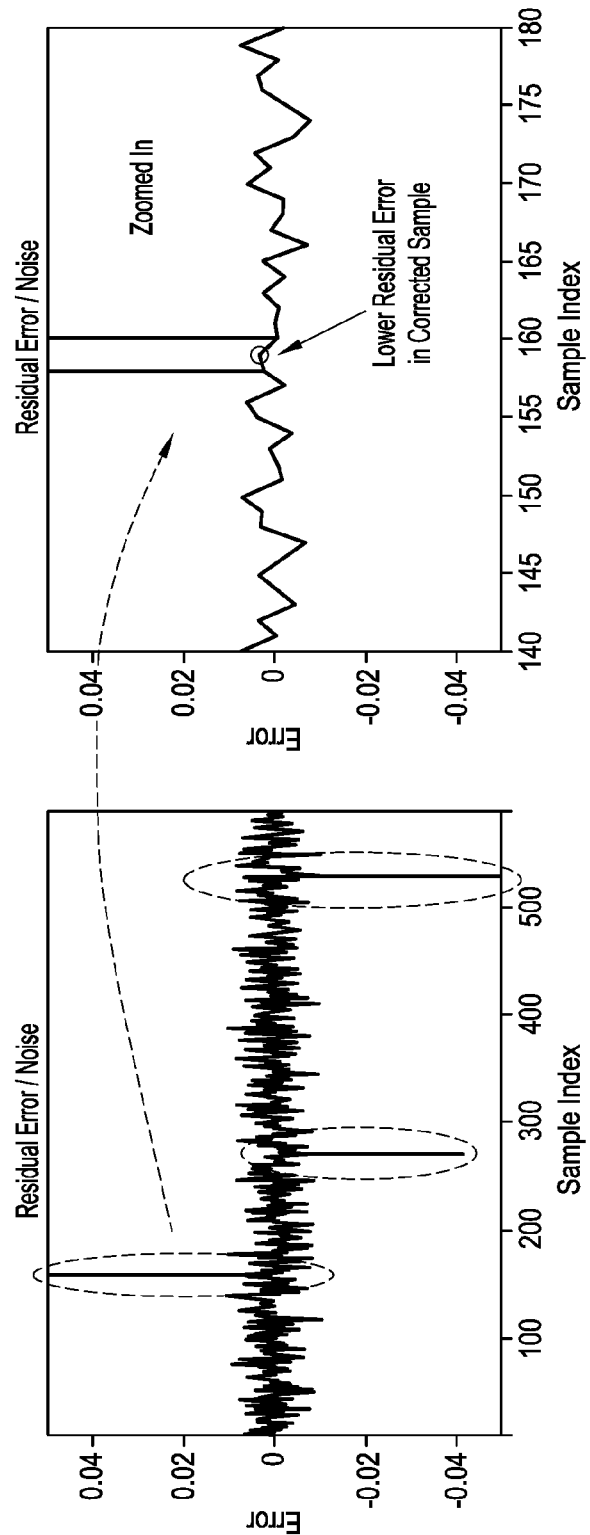
FIGS. 11C and 11D are graphs showing residual error/noise of a large-error detection and correction circuit in FIG. 6, including zoomed-in view, according to a representative embodiment.

An application-specific decision algorithm is a set of rules that is customized for each unique ADC architecture, correction filter, and application domain. An algorithm may simply mark an acquired frame of data as bad data to not be used by subsequent analysis, or may force a sample correction. An illustrative implementation of a sample correction algorithm is to swap out the sample marked as having a metastable error with the output of the interpolation filter 620 by choosing the appropriate input of the multiplexer 670 in the data path (discussed above), an example of which is shown in FIGS. 11A and 11B. The output of the interpolation filter 620 may be a noisy estimate due to finite filter length and finite resolution used to design the interpolation filter 620, resulting in some residual error in the corrected sample, as shown in FIGS. 11C and 11D, for example. However, this still provides a cleaner estimate of the analog input signal than a digital sample corrupted by a large metastable error.

Figures 12A, 12B:
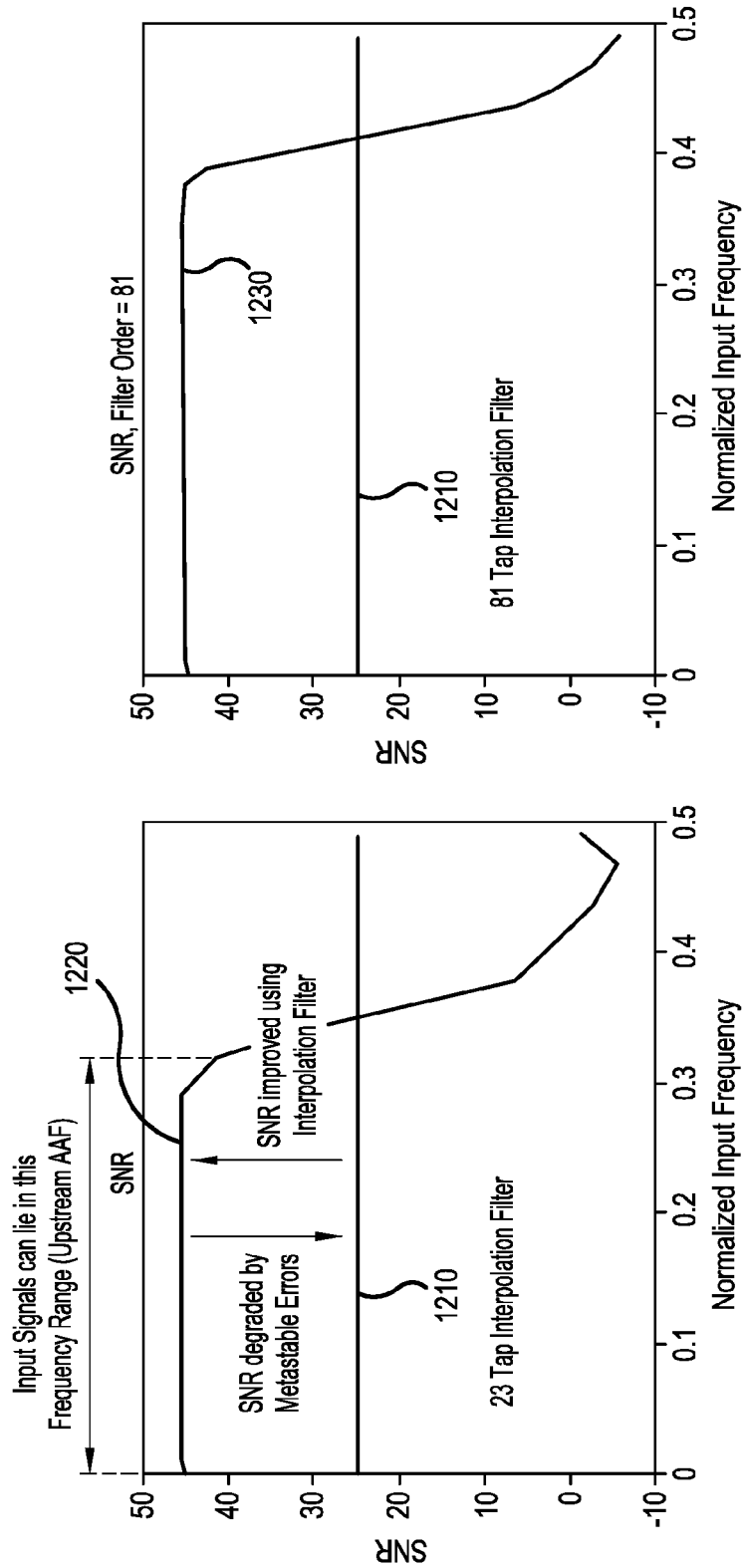
FIGS. 12A and 12B are graphs showing SNR of the signal at the digital output in FIG. 6 versus normalized frequency as functions of the number of taps, according to representative embodiments.

Referring to FIGS. 12A and 12B, the frequency of the analog input signal (or analog stimulus) is swept across the Nyquist band in order to demonstrate the impact of the finite bandwidth of the interpolation filter 620. FIG. 12A depicts the results of a 23 tap interpolation filter 620, where removal of the metastable errors generally results in an approximately 22 dB improvement in SNR from curve 1210 to curve 1220 for analog input signals having frequencies within the bandwidth of the AAF 603. Accordingly, the interpolation filter 620 should be designed in consideration of the bandwidth of the upstream AAF 603. In the example of FIG. 12A, the useable range of correction of the interpolation filter 620 is about 0.30·Fs, at which point the curve 1220 begins to drop off. The system 600 gradually loses effectiveness in recovering the degradation in SNR for frequencies higher than the bandwidth of the interpolation filter 620.

FIG. 12B depicts the results of an 81 tap interpolation filter 620, where removal of the metastable errors still results in an approximately 22 dB improvement in SNR from curve 1210 to curve 1230 for analog input signals having frequencies within the bandwidth of the AAF 603. However, in the example of FIG. 12B, the useable range of correction of the interpolation filter 620 is about 0.38·Fs, at which point the curve 1230 begins to drop off. In both examples, the system 600 gradually loses effect at higher frequencies of the analog input signal, although using more taps in the interpolation filter 620 generally extends the effective range of correction, as shown.

Figure 13:
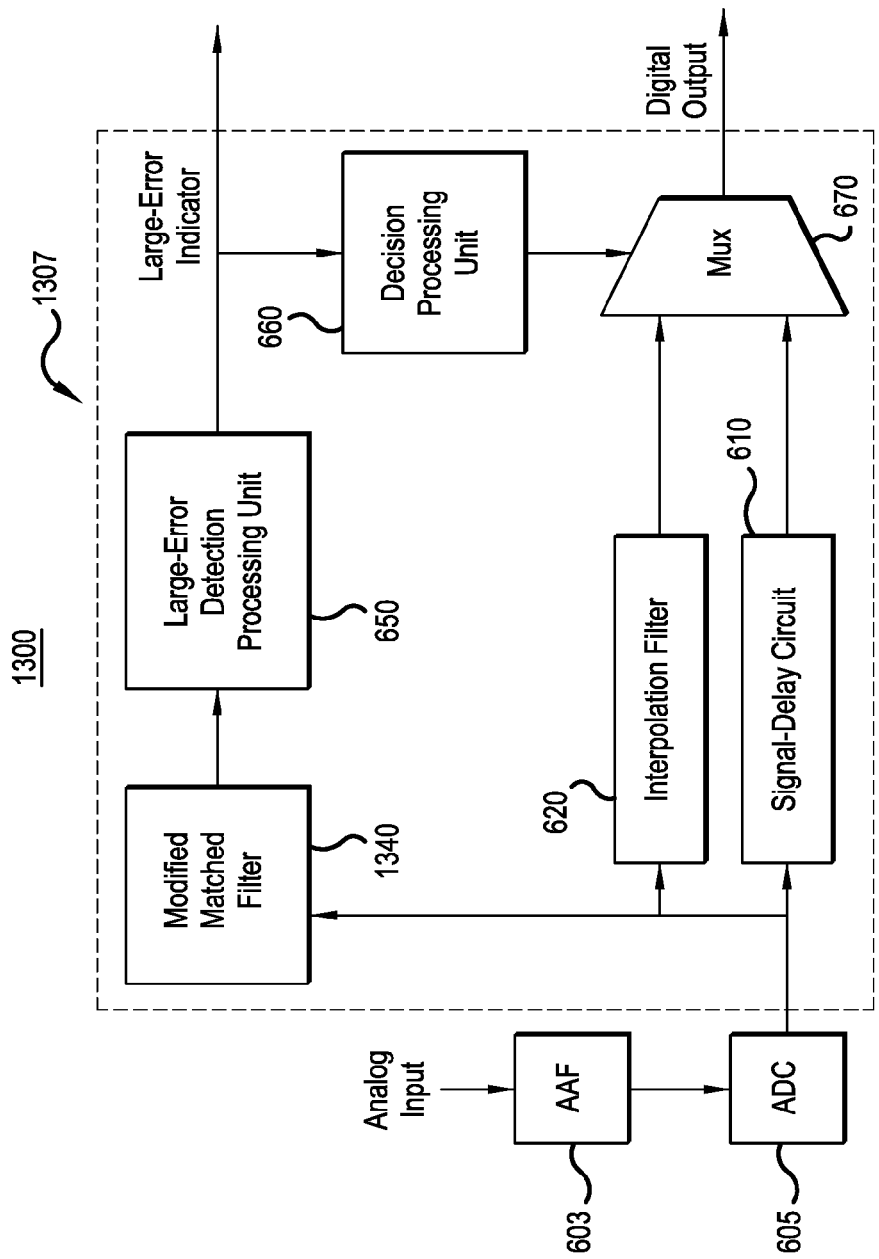
FIG. 13 is a simplified block diagram of a system for detecting and correcting large errors when converting analog input signals to digital signals, according to another representative embodiment.

FIG. 13 is a simplified block diagram of a system for detecting and correcting large errors when converting analog input signals to digital signals, according to another representative embodiment.

Referring to FIGS. 6 and 13, a modified matched filter 1340 of a large-error detection and correction circuit 1307 replaces matched filter 640 of FIG. 6. Also, the adder 630, the first delay circuit 681 and the second delay circuit 682 of FIG. 6 have been eliminated. The matched filter 640 in FIG. 6 has a lag (L2), and further lag is introduced by the large-error detection processing unit 650 and the decision processing unit 660. The control signal input to the multiplexer 670, which controls selection of the first signal path 615 (having lag (L1)) or the second signal path 625, is therefore delayed by an amount equal to the combined lag of the matched filter 640, the large-error detection processing unit 650 and the decision processing unit 660. The effective delay in the signal path from input to the output therefore the sum of lag L1, lag L2 and the combined lag of the large-error detection processing unit 650 and the decision processing unit 660. This total amount of lag may be significant, particularly for lag-sensitive applications.

Accordingly, the system 1300 includes a large-error detection and correction circuit 1307 with a modified matched filter 1340, which is configured to reduce the overall lag. The modified matched filter 1340 has an impulse response $h_3[n]$ having a corresponding transfer function $H_3(z)=(H_1(z)-z^{-L1}) \cdot H_2(z)$. Since the output of the modified matched filter 1340 is used only for large error (e.g., metastable error) detection, a different number of taps may be required to implement this feature pursuant to accuracy requirements (which may vary to provide unique benefits for any particular situation or to meet application specific design requirements of various implementations, as would be apparent to one skilled in the art). If the system requires fewer taps in the modified matched filter 1340, the combined lag through the path including the modified matched filter 1340, the large-error detection processing unit 650 and the decision processing unit 660, may be less than the minimum required lag of the interpolation filter 620.

It may also be inferred from FIG. 13 that if just metastable error detection functionality is needed, without correction, the interpolation filter 620, the decision processing unit 660, and the multiplexer 670 may be eliminated. That is, the modified matched filter 1340 and the large-error detection processing unit 650 are sufficient to simply detect the large errors. As mentioned above with regard to the large-error detection and correction circuit 607, the large-error detection and correction circuit 1307 is instantiated downstream of the ADC 605, prior to any other filtering operation.

The large-error detection and correction may be implemented as part of the digital logic in an ADC integrated circuit, for example, or may also be implemented in an external data receiver, field-programmable gate arrays (FPGAs), application specific integrated circuits (ASICs), system level firmware, and/or software in conjunction with an external ADC. The functionality of the large-error detection and correction circuit may be included in existing designs without significant hardware changes.

For example, all or some of the elements of the large-error detection and correction circuit 607, 1307, including the large-error detection processing unit 650, the decision processing unit 660, and/or various filter and delay circuits, may be implemented by a computer processor, ASICs, FPGAs, or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system. A memory (not shown) may be implemented by any number, type and combination of random access memory (RAM) and read-only memory (ROM), for example, and may store various types of information, such as computer programs and software algorithms executable by the computer processor (and/or other components), as well as raw data and/or data storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are non-transitory (e.g., as compared to transitory propagating signals).

A user interface (I/F) (not shown) with the system 600, 1300 for enabling interaction with a user and/or another test device. For example, the user I/F may include a display, as well a user input device configured to receive user commands. The user input device may include a keyboard, a mouse, a touch pad and/or a touch-sensitive display, although any other compatible means of providing input may be incorporated without departing from the scope of the present teachings. The user I/F may be used, for example, to enable a user to set predetermined thresholds for determining occurrences of large errors (e.g., metastable errors).

Figure 14:
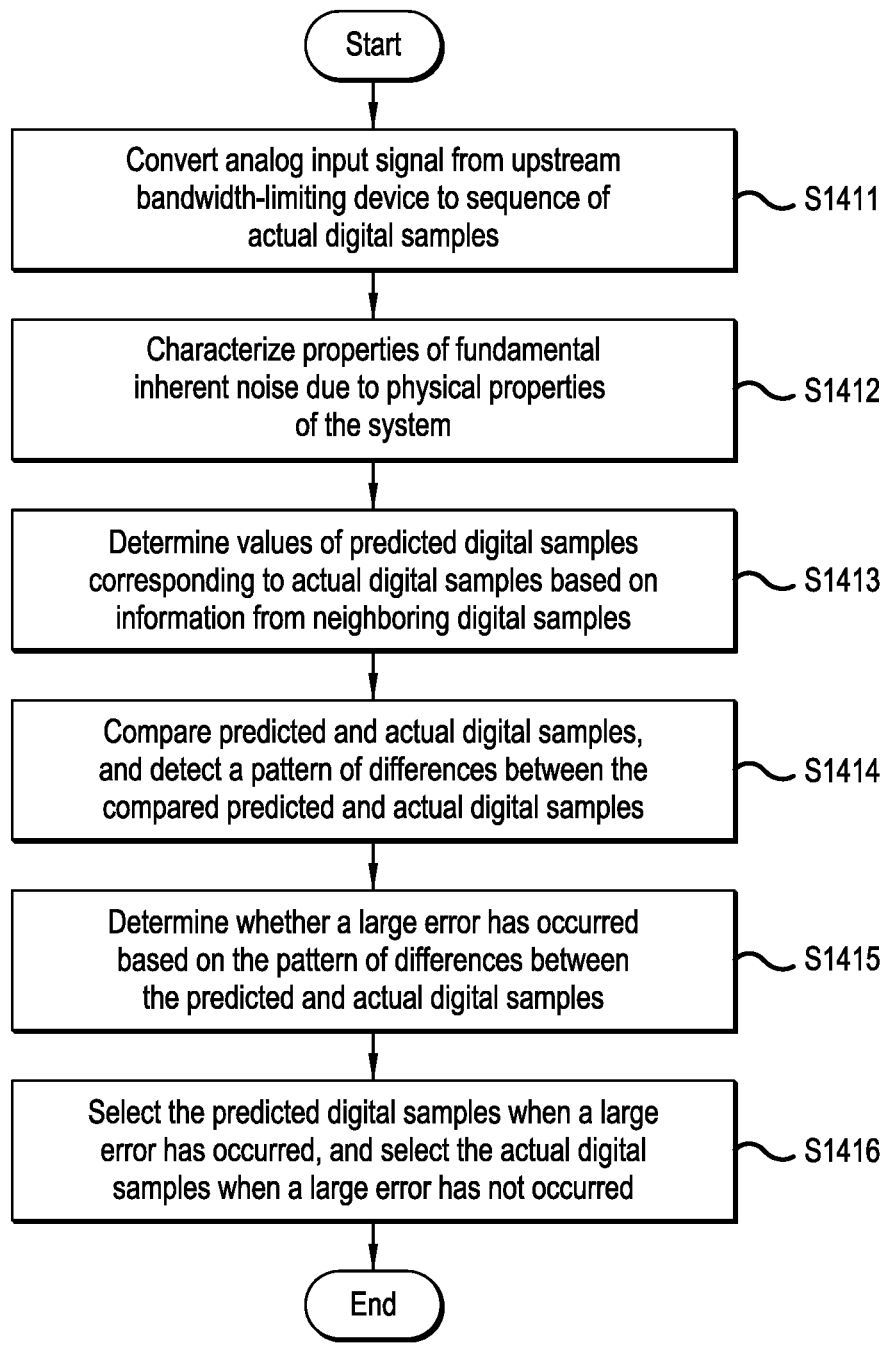
FIG. 14 is a flow diagram of a method for detecting and correcting large errors when converting analog input signals to digital signals, according to a representative embodiment.

FIG. 14 is a flow diagram of a method for detecting and correcting large errors when converting analog input signals to digital signals, according to a representative embodiment. The system includes an ADC and a bandwidth-limiting device upstream from the ADC for receiving an analog input signal.

Referring to FIG. 14, in block S1411, an analog input signal received from the upstream bandwidth-limiting device is converted into a sequence of actual digital samples at predetermined time intervals by the ADC. Properties of fundamental inherent noise due to physical properties of the system are characterized in block S1412. The fundamental inherent noise may include, for example, thermal noise, shot noise and flicker noise.

In block S1413, values are determined of predicted digital samples corresponding to the actual digital samples in the sequence of actual digital samples, based on information from one or more neighboring digital samples, respectively. The neighboring digital samples include representations of the analog input signal and the fundamental inherent noise due to physical properties of the system, characterized in block S1412. The predicted digital samples are compared with corresponding actual digital samples and a pattern of differences is detected between the compared predicted digital samples and the corresponding actual digital samples in block S1414.

In block S1415, it is determined whether a large error has occurred based on the pattern of differences between the predicted corresponding actual digital samples. In particular, a large error is determined to have occurred when a pattern of the differences between the predicted digital samples and the corresponding actual digital samples of the sequence of digital samples as detected at the output of the matched filter exceeds a predetermined threshold of the fundamental inherent noise within the system. In block S1416, the predicted digital samples are selected for output when it is determined that a large error has occurred, and the actual digital samples are selected for output when it is determined that a large error has not occurred.

The various components, structures, parameters and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A system for detecting and correcting large errors during an analog-to-digital conversion operation, the system comprising:
   an analog-to-digital converter (ADC) configured to convert an analog input signal, received at an input of the ADC, into a sequence of digital samples at predetermined time intervals;
   an analog anti-alias filter (AAF) at the input of the ADC, the AAF having a bandwidth less than an information bandwidth of the ADC, thereby limiting a functional bandwidth of the ADC; and
   a large-error detection and correction processing unit at an output of the ADC, the large-error detection and correction circuit comprising:
      an interpolation filter configured to determine values of predicted digital samples corresponding to actual digital samples in the sequence of digital samples from the ADC based on information from one or more neighboring digital samples, respectively, in the sequence of digital samples, wherein the neighboring digital samples include representations of the analog input signal and fundamental inherent noise due to physical properties of the system;
      a signal-delay circuit in parallel with the interpolation filter and configured to delay the actual digital samples in the sequence of digital samples by an amount equal to a lag resulting from the interpolation filter determining the values of the predicted digital samples, respectively;
      an adder configured to determine differences between the predicted digital samples from the interpolation filter and the corresponding actual digital samples from the delay circuit, respectively;
      a matched filter configured to detect a pattern of the differences between the predicted digital samples and the actual digital samples; and
      a large-error detection processing unit configured to determine whether a large error occurs in the sequence of digital samples based on the pattern of the differences between the predicted and actual digital samples.

2. The system of claim 1, wherein the fundamental inherent noise comprises thermal noise, shot noise and flicker noise due to the physical properties of the system.

3. The system of claim 1, wherein the large-error detection processing unit determines that a large error has occurred in the sequence of digital samples when the pattern of the differences between the predicted digital samples and the actual digital samples comprises a difference that exceeds a predetermined threshold of the fundamental inherent noise within the system.

4. The system of claim 1, wherein the large error comprises a metastable error generated by the ADC.

5. The system of claim 1, wherein the large-error detection and correction processing unit further comprises:
   a multiplexer configured to receive the actual digital samples from the signal-delay circuit via a first signal path, to receive the respective predicted digital samples from the interpolation filter via a second signal path, and to output a selected one of the actual digital samples and the respective predicted digital samples.

6. The system of claim 5, wherein the large-error detection and correction processing unit further comprises:
   a decision processing unit configured to receive a large-error indicator from the large-error detection processing unit when the large-error detection processing unit determines that a large error has occurred in the sequence of digital samples, and to control the multiplexer to output the respective predicted digital samples received via the second signal path when the large-error indicator is received, and to output the actual digital samples received via the first signal path when the large-error indicator is not received.

7. The system of claim 6, the large-error detection and correction processing unit further comprises:
- a first delay circuit in the first signal path between the signal-delay circuit and the multiplexer, the first delay circuit being configured to delay the actual digital samples in the first signal path by an amount equal to a lag resulting from the matched filter detecting the pattern, the large-error detection processing unit determining whether a large error occurs in the sequence of digital samples, and the decision processing unit controlling the multiplexer; and
- a second delay circuit in the second signal path between the interpolation filter and the multiplexer, the second delay circuit being configured to delay the respective predicted digital samples in the second signal path by the amount equal to the lag resulting from the matched filter detecting the pattern, the large-error detection processing unit determining whether a large error occurs in the sequence of digital samples, and the decision processing unit controlling the multiplexer.

8. The system of claim 6, wherein the large-error indicator, received by the decision processing unit from the large-error detection processing unit, comprises at least one of a trigger, a flag and a status bit.

9. The system of claim 5, wherein the large-error detection and correction processing unit further comprises:
- a decision processing unit configured to receive a large-error indicator from the large-error detection processing unit when the large-error detection processing unit determines that a large error has occurred in the sequence of digital samples, to apply an application specific algorithm when the large-error indicator is received, and to determine whether to correct the large error or to pass the large-error indicator to a downstream error handling routine, in accordance with the application specific algorithm,
- wherein, when the application specific algorithm provides for correction of the large error, the decision processing unit controls the multiplexer to output the respective predicted digital samples received via the second signal path.

10. The system of claim 1, wherein the information bandwidth of the ADC comprises a Nyquist bandwidth.

11. The system of claim 1, wherein the matched filter has an impulse response that is a complex conjugate time-reversed version of the detected pattern.

12. A method of detecting and correcting large errors during operation of a system for converting analog input signals to digital output signals, the system including an analog-to-digital converter (ADC) and an upstream bandwidth-limiting device, the method comprising:

- converting an analog input signal received from the upstream bandwidth-limiting device into a sequence of actual digital samples at predetermined time intervals;
- characterizing properties of fundamental inherent noise due to physical properties of the system, the fundamental inherent noise including one or more of thermal noise, shot noise and flicker noise;
- determining values of predicted digital samples corresponding to the actual digital samples in the sequence of digital samples based on information from one or more neighboring digital samples, respectively, wherein the neighboring digital samples include representations of the analog input signal and the fundamental inherent noise due to physical properties of the system;
- comparing the predicted digital samples with corresponding actual digital samples and detecting a pattern of differences between the compared predicted digital samples and the corresponding actual digital samples using matched filter; and
- determining whether a large error has occurred based on the pattern of differences between the predicted and the corresponding actual digital samples detected by the matched filter,
- wherein it is determined that a large error has occurred when a difference between the predicted digital samples and the corresponding actual digital samples of the sequence of digital samples exceeds a predetermined threshold of the fundamental inherent noise within the system.

13. The method of claim 12, further comprising:
- selecting for output the predicted digital samples when it is determined that a large error has occurred, and
- selecting for output the actual digital samples when it is determined that a large error has not occurred.

14. The method of claim 12, wherein the large error comprises a metastable error.

15. The method of claim 12, wherein determining whether a large error has occurred is performed prior to subsequent downstream digital signal processing.

16. The method of claim 12, wherein characterizing the properties of the fundamental inherent noise within the system comprises application of Gaussian statistics.

17. The method of claim 16, wherein the fundamental inherent noise is identified by at least one of signal-to-noise ratio (SNR) and noise spectral density (NSD).

18. The method of claim 12, wherein the upstream bandwidth-limiting device comprises a low-pass or band-pass analog anti-alias filter.

* * * * *